United States Patent

Nakamura

[11] Patent Number: 5,548,594
[45] Date of Patent: Aug. 20, 1996

[54] COMPACT AGC CIRCUIT WITH STABLE CHARACTERISTICS

[75] Inventor: Naoyuki Nakamura, Tokyo, Japan

[73] Assignee: NEC Corporation, Tokyo, Japan

[21] Appl. No.: 364,450

[22] Filed: Dec. 27, 1994

[30] Foreign Application Priority Data

Dec. 28, 1993 [JP] Japan .................... 5-336199

[51] Int. Cl.$^6$ .................................. H04B 1/06
[52] U.S. Cl. ................... 370/95.3; 455/136; 455/138; 455/234.2; 455/245.1; 455/250.1; 455/311; 375/345
[58] Field of Search ............... 370/95.3, 95.1, 370/77; 455/234.1, 234.2, 245.1, 249.1, 250.1, 239.1, 136, 138, 241.1, 311; 375/316, 317, 318, 345

[56] References Cited

U.S. PATENT DOCUMENTS

| | | | |
|---|---|---|---|
| 4,656,630 | 4/1987 | Miyo | 370/95.3 |
| 4,757,502 | 7/1988 | Meuriche et al. | 370/95.3 |
| 4,989,074 | 1/1991 | Matsumoto | 455/234.1 |
| 5,001,776 | 3/1991 | Clark | 455/234.1 |
| 5,142,695 | 8/1992 | Roberts et al. | 455/89 |
| 5,184,349 | 2/1993 | Riordan | 455/250.1 |
| 5,276,685 | 1/1994 | Kepler et al. | 370/95.3 |
| 5,301,364 | 4/1994 | Arens et al. | 370/95.3 |
| 5,331,638 | 7/1994 | Honkasalo et al. | 370/95.3 |
| 5,361,395 | 11/1994 | Yamamoto | 370/95.3 |

FOREIGN PATENT DOCUMENTS

| | | |
|---|---|---|
| 0559093 | 9/1993 | European Pat. Off. . |
| 3122457 | 1/1983 | Germany . |
| 2195847 | 4/1988 | United Kingdom . |
| 2233846 | 1/1991 | United Kingdom . |

*Primary Examiner*—Alpus H. Hsu
*Assistant Examiner*—Ricky Q. Ngo
*Attorney, Agent, or Firm*—Sughrue, Mion, Zinn, Macpeak & Seas

[57] ABSTRACT

In an automatic gain control circuit which has a variable gain amplifier 30 for amplifying an input TDM reception signal 160 in accordance with a controllable gain, an analog-to-digital converter 40 for converting an amplified TDM reception signal 170 into a digital signal 180, and control section 50 for determining an optimized value of the controllable gain in response to the digital signal 180 so as to supply the variable gain amplifier 30 with the optimized value of the controllable gain, the optimized value of the controllable gain is determined by the use of a signal of the time slot S(−1) immediately before the predetermined time slot S(0) when receiving the input TDM reception signal 160.

3 Claims, 4 Drawing Sheets

COMPACT AGC CIRCUIT WITH STABLE CHARACTERISTICS

BACKGROUND OF THE INVENTION

This invention relates to an Automatic Gain Control (AGC) circuit For use in a radio receiving apparatus with a Time Division Multiple Access (TDMA) transmission system.

Such an AGC circuit automatically controls a gain of an amplifier so as to keep an average amplitude of a demodulator input signal at a constant level.

A conventional AGC circuit of the type described comprises a variable gain amplifier for amplifying an input reception signal in accordance with a controllable gain to produce an amplified reception signal, a detector for detecting an envelope of the amplified reception signal to produce a detected signal, a comparator for comparing the detected signal with a predetermined voltage signal to determine a difference therebetween. The difference is supplied to the variable gain amplifier as the controllable gain.

However, since the conventional AGC circuit mainly comprises hardwares, such as the detector and the comparator, unevenness of characteristics cannot be avoided. In addition, the conventional AGC circuit inevitably becomes complicated in construction. Accordingly, a radio receiving apparatus having the conventional AGC circuit therein cannot be fabricated at a low cost.

Furthermore, as processing speed of the input reception signal is under the influence of response speed of the detector and the comparator, it is difficult that the conventional AGC circuit follows up a fast burst signal.

SUMMARY OF THE INVENTION

It is therefore an object of this invention to provide AGC circuits which are compact in construction and even in characteristics to each other.

Other objects of this invention will become clear as the description proceeds.

On describing the gist of the present invention, it is possible to understand that the automatic gain control circuit is for use in a radio receiving apparatus supplied with input TDM (Time Division Multiplex) reception signals having each signal contained in each of a plurality of time slots one of which is a predetermined time slot assigned to a user of the radio receiving apparatus.

In accordance with this invention, the above-understood automatic gain control circuit comprising: a variable gain amplifier for amplifying the input TDM reception signals in accordance with a controllable gain to produce amplified TDM reception signal; an analog-to-digital converter for converting the amplified TDM reception signals into digital signals; and control means for determining an optimized value of the controllable gain in response to the digital signals so as to supply the variable gain amplifier with the optimized value of the controllable gain by the use of a signal of the time slot immediately before the predetermined time slot when receiving the input TDM reception signals.

The control means may comprises reading means for reading an input level of a reception signal contained an the time slot immediately before the predetermined time slot; memorizing means for memorizing the input level determining means for determining an absolute value in the input level; comparing means for comparing the absolute value with a previous maximum value of a previous input level to provide a new maximum value of the input levels; deciding means for deciding a relative indication value with respect to an optimized reception gain which has already been supplied to the variable gain amplifier adding means for adding the relative indication value to the optimized reception gain which has already been supplied to the variable gain amplifier to provide a new optimized reception gains and supplying means for supplying the new optimized reception gain to the variable gain amplifier.

The control means may comprise a software of a control program.

DESCRIPTION OF THE PREFERRED EMBODIMENT

Figure 1:
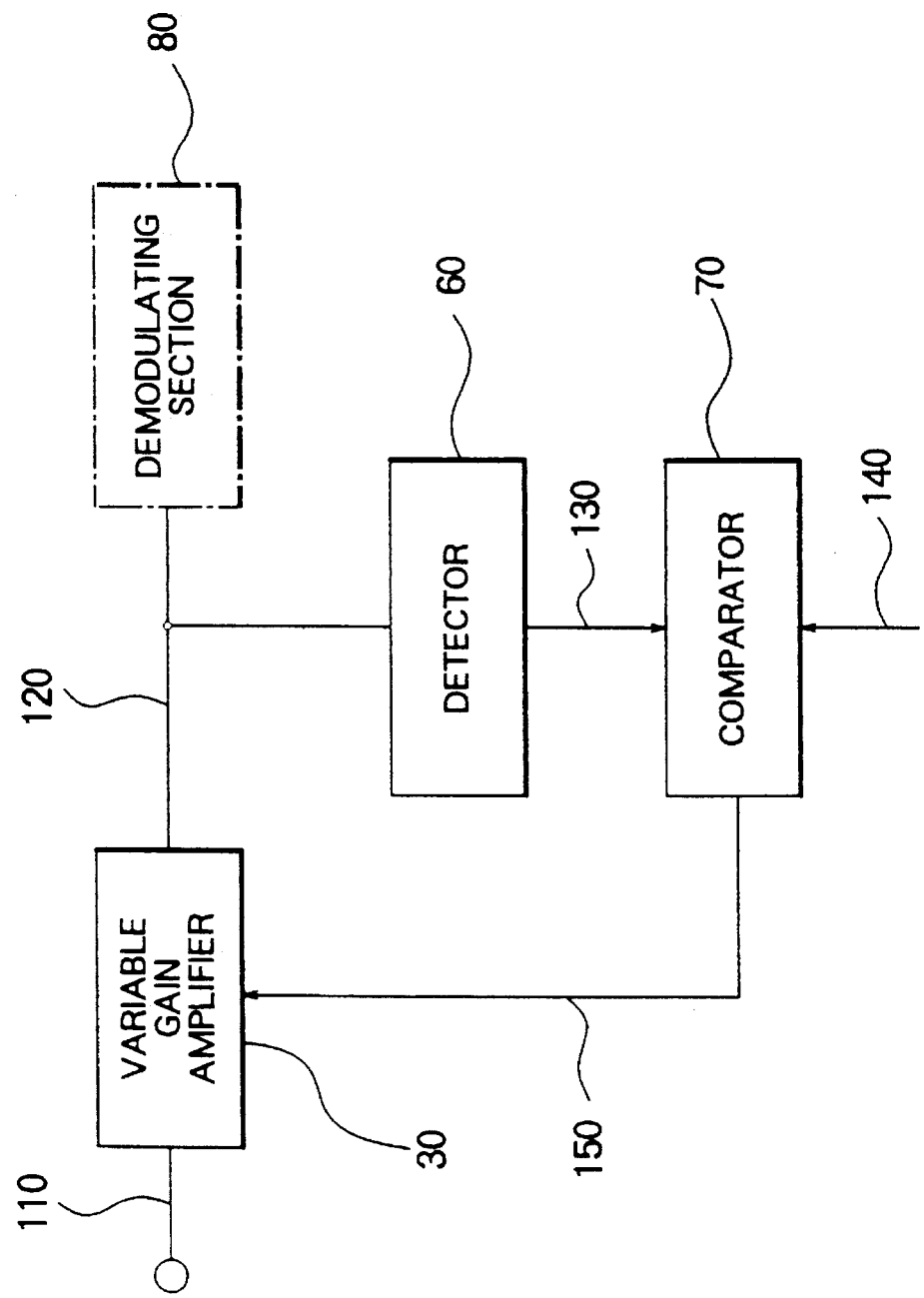
FIG. 1 is a block diagram of a conventional automatic gain control circuit.

Referring to FIG. 1, description is, at first, made about a conventional automatic gain control circuit for a better understanding of this invention.

An illustrated in FIG. 1, the conventional automatic gain control circuit comprises a variable gain amplifier 30 for amplifying an input reception signal 110 in accordance with a controllable gain to produce an amplifier reception signal 120, a detector 60 for detecting an envelope of the amplified reception signal 120 to produce a detected signal 130, a comparator 70 for comparing the detected signal 130 with a reference voltage signal 140 to determine a difference between the detected signal 130 and the reference voltage signal 140. The difference is supplied to the variable gain amplifier 30 as a gain control signal 150. Thus, the amplified reception signal 120 is supplied to a demodulating section 80 with an average amplitude thereof being kept at a constant level.

However, since the conventional AGC circuit illustrated in FIG. 1 mainly comprises hardwares, such as the detection 60 and the comparator 70, unevenness of characteristics cannot be avoided. In addition, the conventional AGC circuit inevitably becomes complicated in construction. Accordingly, a radio receiving apparatus having the conventional AGC Circuit therein cannot be fabricated at a low cost.

Furthermore, as processing speed of the input reception signal 110 is under the influence of response speed of the detector 60 and the comparator 70, it is difficult that the conventional AGC circuit follows up a fast burst signal.

Figures 2, 3:
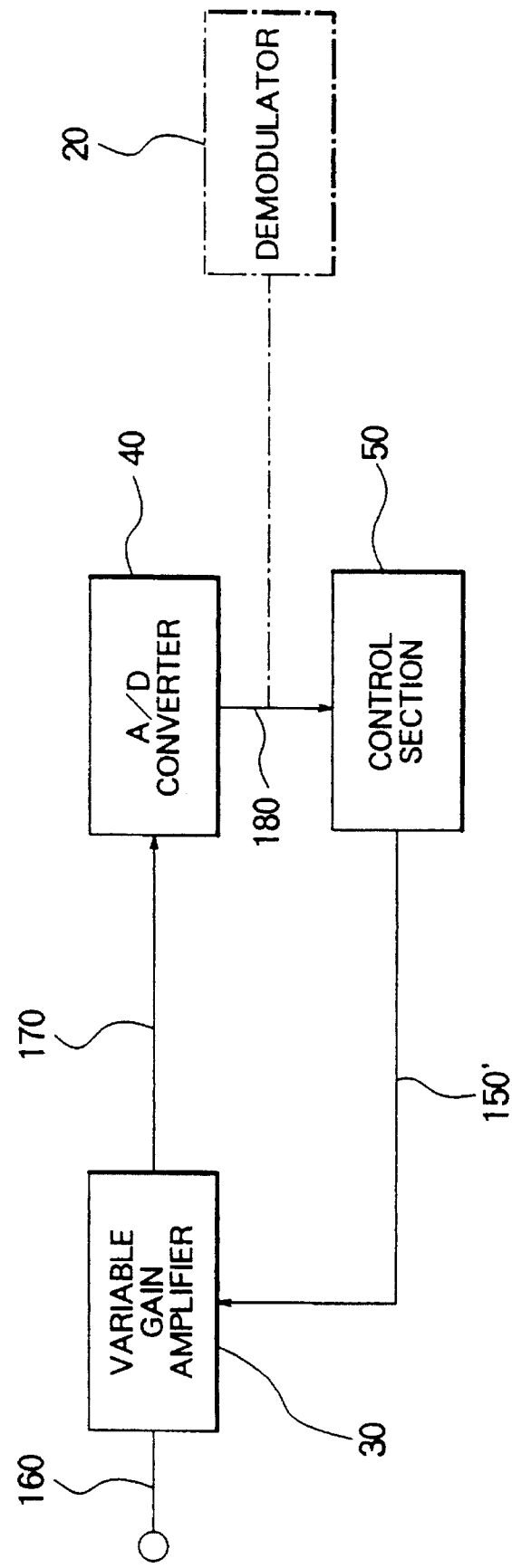
FIG. 2 is a view for illustrating time slots each of which has a reception signal assigned to each user in TDM reception signals.
FIG. 3 is a block diagram of an automatic gain control circuit according to an embodiment of this invention.

Referring to FIGS. 2 and 3, description will proceed to an AGC circuit according to an embodiment of this invention.

In FIG. 2, illustration is made about a plurality of time slots S(−2) to S(2). Each of the time slots S(−2) to S(2) has a corresponding reception signal assigned to each user in the TDM radio communication system.

Referring in turn to FIG. 3, the automatic gain control circuit is for use in a radio receiving apparatus supplied with input TDM (Time Division Multiplex) reception signals 160 having each signal contained in each of the time slots S(−2) to S(2) illustrated in FIG. 2. The illustrated time slot S(0) is a predetermined one which is assigned to a user of the radio receiving apparatus including the automatic gain control circuit therein.

In FIG. 3, the automatic gain control circuit comprises a variable gain amplifier 30 for amplifying the input TDM reception signals 160 in accordance with a controllable gain to produce amplified TDM reception signals 170, an analog-to-digital converter 40 for converting the amplified TDM reception signals 170 into digital signals 180, and a control section 50 for determining an optimized value of the controllable gain in response to the digital signals 180 so as to supply the variable gain amplifier 30 with the optimized value of the controllable gain as a gain control signal 150' by the use of a signal of the time slot S(−1) immediately before the predetermined time slot S(0) when receiving the input TDM reception signals 160. Besides, in this embodiment, the above-mentioned digital signals 180 are supplied to a demodulator 20 of the radio receiving apparatus, as demodulator input signals. The demodulator 20 demodulates demodulator input signals, namely, digital signals 180, into demodulated digital data signals.

Referring to FIGS. 2 and 3 continued, description will proceed to an operation of the AGC circuit illustrated in FIG. 3.

In this embodiment, when the control section 50 receives a reception signal contained in the time slot S(−1) immediately before the predetermined time slot S(0), the control section 50 determines a maximum value and an optimized reception gain in the reception signal contained in the time slot S(−1). By the use of the maximum value and the optimizes reception gain in the reception signal contained in the time slot S(−1), the control section 50 controls the variable gain amplifier 30 so that a reception gain from a beginning point to an ending point of the predetermined time slot S(0) becomes the optimized reception gain in the time slot S(−1).

Namely, the radio receiving apparatus receives a reception signal of the time slot S(−1) immediately before the predetermined time slot S(0) of a TDMA frame in a TDM reception signal 160. The reception signal of the time slot S(−1) is supplied to the variable gain amplifier 30. The variable gain amplifier 30 amplifies the reception signal of the time slot S(−1) to produce an amplified TDM reception signal 170. The amplified TDM reception signal 170 is converted into a digital signal 180 by the analog-to-digital converter 40. The digital signal 180 is then supplied to the control section 50. The control section 50 determines the maximum value in input levels of the reception signal contained in the time slot S(−1). With reference to the maximum value, the control section 50 determines the optimized reception gain in the reception signal contained in the time slot S(−1). The optimized reception gain is supplied to the variable gain amplifier 30 as the gain control signal 150' so that an optimized reception gain is obtained in the predetermined time slot S(0).

Figure 4:
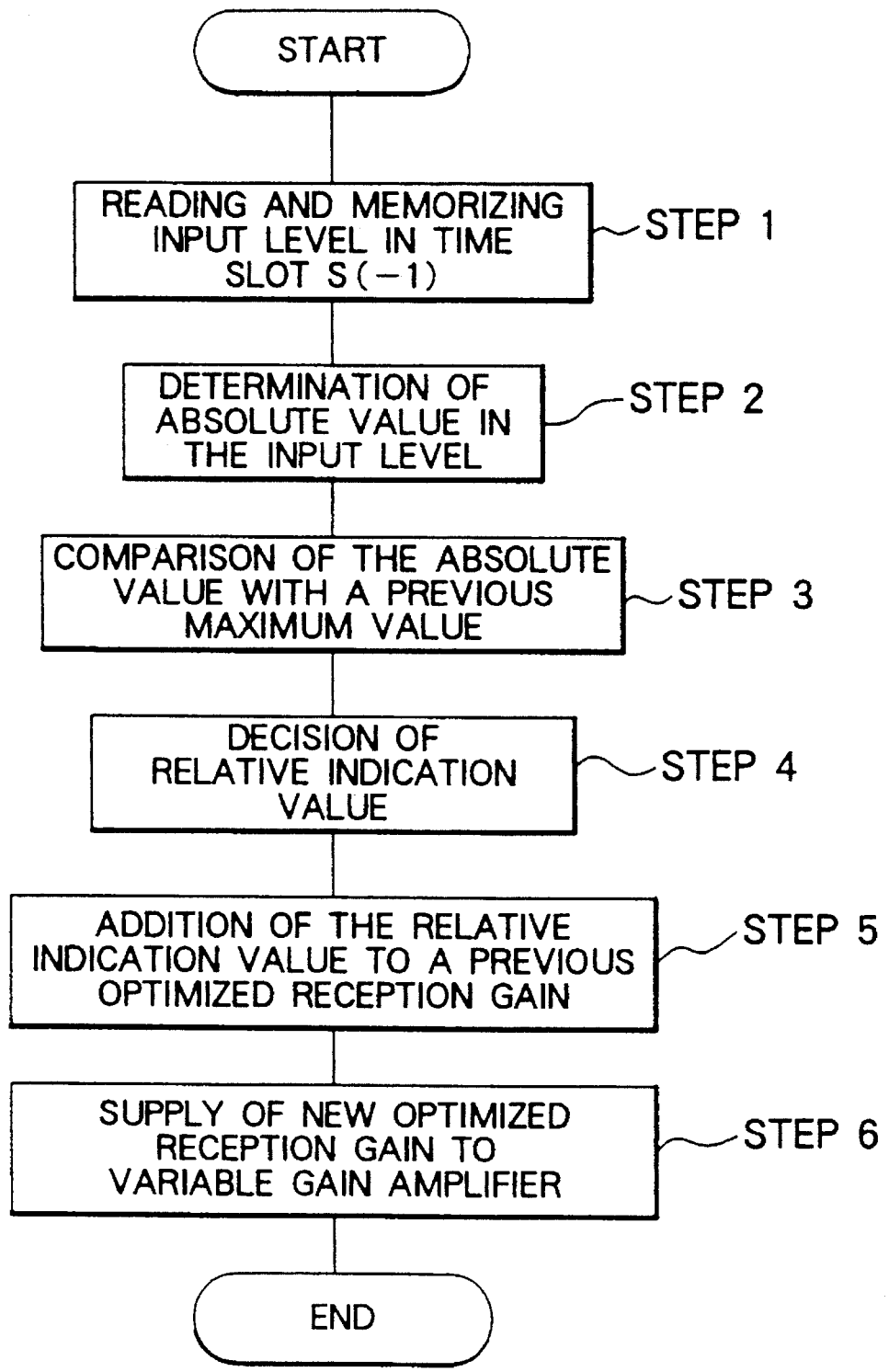
FIG. 4 is a flow chart of determination of an optimized reception gain by a control section.

Referring now to FIG. 4, description is made about a flow of the determination of the optimized reception gain by the control section 50.

At first, the input levels of the reception signal contained in the time slot S(−1), which converted into a digital signal 180, are read and memorized by the control section 50 (Step 1)

Then, the absolute value in the input levels is determined (Step 2).

The absolute value thus determined is compared with a maximum value of input levels which have already been determined to provide a new maximum value of input levels (Step 3).

Thereafter, based on the new maximum value of input levels provided in Step 3, a relative indication value is decided with respect to the optimized reception gain which has already been supplied to the variable gain amplifier 30 (Step 4).

Further, the relative indication value is added to the optimized reception gain which has already been supplied to the variable gain support 30 to provide a new optimized reception gain (Step 5).

The new optimized reception gain is then supplied to the variable gain amplifier 30 (Step 6).

Figure 5:
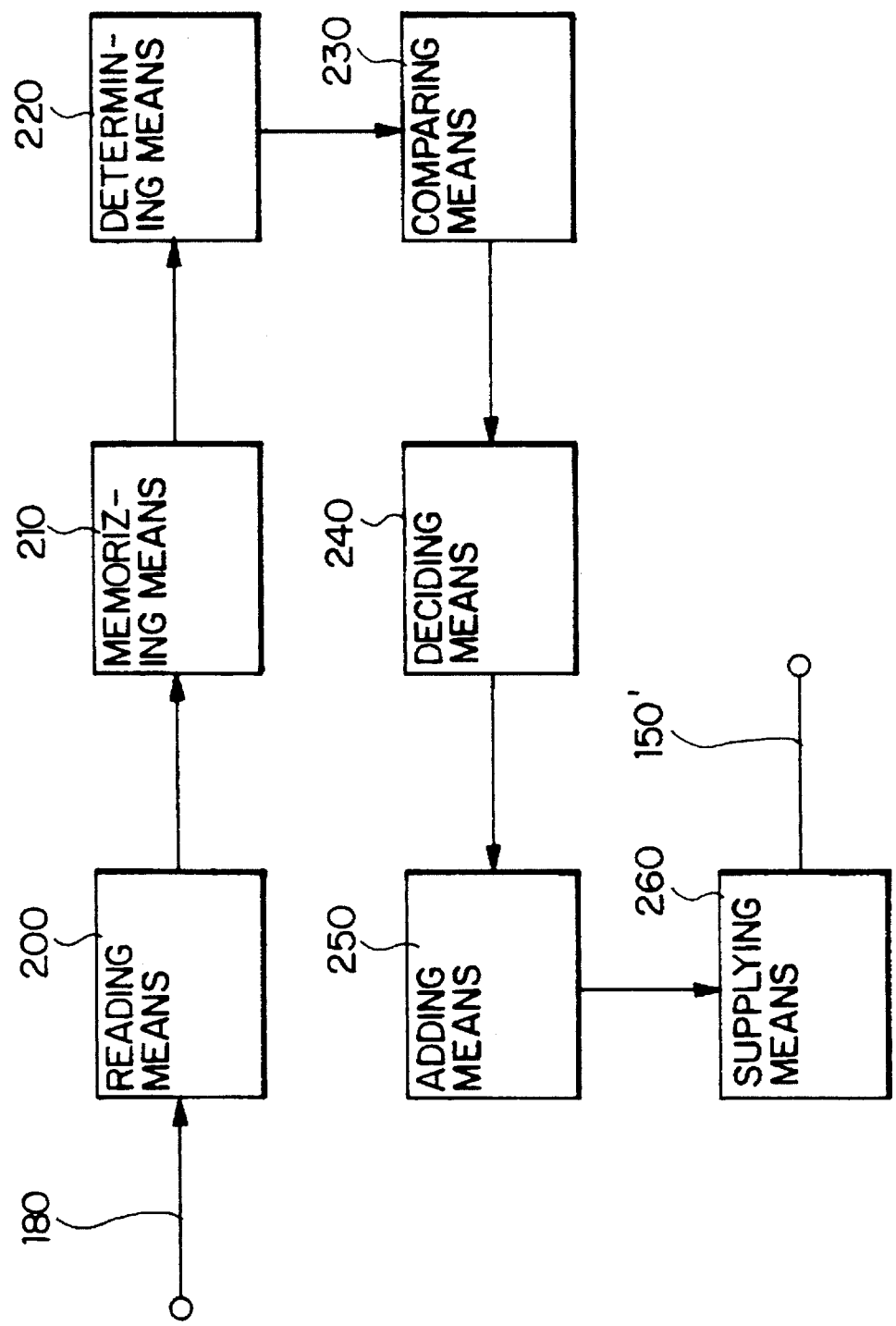
FIG. 5 is a block diagram of one embodiment of the control section shown in FIG. 3.

Through the Steps 1 to 6, an optimized reception gain can be obtained in the predetermined time slot S(0). The control section 50 may comprise the components illustrated in FIG. 5. As shown in the figure, the control section 50 may comprise a reading means 200, a memorizing means 210, a determining means 220, a comparing means 230, a deciding means 240, an adding means 250, and a supplying means 260.

As described above, according to the AGC circuit of this invention, gain control is carried out by a digital signal processing. There can be provided AGC circuits which are compact in construction and even in characteristics to each other. In addition, there can be provided an AGC circuit which is stable in characteristic. It is possible that the gain control is carried out without control hysteresis.

Addition and modification of the functions of the AGC circuit can be achieved by a partial modification of the softwares, such as the control program of the control section 50. Accordingly, the functions of the AGC circuit can be readily modified without a modification of the hardwares, such as the detector 60 and the comparator 70, as would be required in the conventional AGC circuit.

It becomes possible to provide a radio receiving apparatus with an AGC circuit capable of expanding a dynamic range of an AGC amplifier in response to variation of an input field strength by controlling the reception gain.

While this invention has thus far been described in specific conjunction with an embodiment thereof, it will now be readily possible for one skilled in the art to put this invention into effect in various other manners. For example, the analog-to-digital converter 40 and the control section 50 may be included within a demodulating section together with the demodulator 20.

What is claimed is:

1. An automatic gain control circuit for use in a radio receiving apparatus supplied with input TDM (Time Division Multiplex) reception signals having each signal contained in each of a plurality of time slots one of which is a predetermined time slot assigned to a user of said radio receiving apparatus, said automatic gain control circuit comprising:

a variable gain amplifier for amplifying said input TDM reception signals in accordance with a controllable gain to produce amplified TDM reception signals;

an analog-to-digital converter for converting said amplified TDM reception signals into digital signals; and control means for determining an optimized value of said controllable gain in response to said digital signals so as to supply said variable gain amplifier with said optimized value of said controllable gain by the use of a signal of the time slot immediately before said predetermined time slot when receiving said input TDM reception signals, wherein said control means comprises:

reading means for reading an input level of a reception signal contained in the time slot immediately before said predetermined time slot;

memorizing means for memorizing said input level;

determining means for determining an absolute value in said input level;

comparing means for comparing said absolute value with a previous maximum value of a previous input level to provide a new maximum value of the input levels;

deciding means for deciding a relative indication value with respect to an optimized reception gain which has already been supplied to said variable gain amplifier and with respect to said new maximum value;

adding means for adding said relative indication value to the optimized reception gain which has already been supplied to said variable gain amplifier to provide a new optimized reception gain; and supplying means for supplying said new optimized reception gain to said variable gain amplifier.

2. An automatic gain control circuit as claimed in claim 1, wherein said control means comprises a software of a control program.

3. A method of determining an optimized reception gain signal which controls a gain of an automatic gain control circuit used in a receiving apparatus supplied with input TDM (Time Division Multiplex) reception signals respectively contained in a plurality of time slots, wherein one of said time slots is a predetermined time slot assigned to a user of said receiving apparatus and wherein said method comprises the steps of:

reading an input level of a first reception signal contained in a time slot immediately preceding said predetermined time slot;

memorizing said input level;

determining an absolute value of said input level;

generating a new maximum value of said input level by comparing said absolute value with a previous maximum value of a previous input level;

determining a relative indication value with respect to a previous optimized reception gain signal which has been previous supplied to said variable gain amplifier and with respect to said new maximum value;

generating a new optimized reception gain signal by adding said relative indication value to said previous optimized reception gain signal; and supplying said new optimized reception gain signal to said variable gain amplifier.

\* \* \* \* \*